US011236990B2

(12) United States Patent
Yelton (10) Patent No.: US 11,236,990 B2
(45) Date of Patent: Feb. 1, 2022

(54) DE-JITTER OF POINT CLOUD DATA

(71) Applicant: The Boeing Company, Chicago, IL (US)

(72) Inventor: Dennis J. Yelton, Albuquerque, NM (US)

(73) Assignee: The Boeing Company, Chicago, IL (US)

( * ) Notice: Subject to any disclaimer, the term of this patent is extended or adjusted under 35 U.S.C. 154(b) by 210 days.

(21) Appl. No.: 16/785,574

(22) Filed: Feb. 8, 2020

(65) Prior Publication Data

US 2021/0247179 A1    Aug. 12, 2021

(51) Int. Cl.
| | |
|---|---|
| *G06K 9/00* | (2006.01) |
| *G01B 11/10* | (2006.01) |
| *G01S 17/894* | (2020.01) |
| *H01L 31/107* | (2006.01) |
| *G06T 7/12* | (2017.01) |

(52) U.S. Cl.
CPC .......... *G01B 11/105* (2013.01); *G01S 17/894* (2020.01); *G06T 7/12* (2017.01); *H01L 31/107* (2013.01); *G06T 2207/10028* (2013.01)

(58) Field of Classification Search
CPC ... G01B 11/105; G01S 17/894; G01S 7/4876; G01S 7/4863; G06T 7/12; G06T 2207/10028; H01L 31/107; G06K 2209/40; G06K 9/00208; G06K 9/00476; G06K 9/00637; G06K 9/46
USPC ......................................................... 382/154
See application file for complete search history.

(56) References Cited

U.S. PATENT DOCUMENTS

| | | | |
|---|---|---|---|
| 6,731,283 B1 | 5/2004 | Navab | |
| 9,128,185 B2 * | 9/2015 | Zeng | G01S 17/931 |
| 9,128,188 B1 * | 9/2015 | Hilde | G06T 7/74 |
| 9,329,269 B2 * | 5/2016 | Zeng | G01S 17/931 |
| 9,606,233 B2 * | 3/2017 | Sebastian | G01S 7/4808 |
| 9,804,597 B1 * | 10/2017 | Ferguson | G01S 13/02 |
| 9,983,309 B2 | 5/2018 | Sebastian et al. | |
| 10,024,664 B1 * | 7/2018 | Gill | G01C 21/00 |
| 10,436,884 B2 * | 10/2019 | Wu | G01S 17/86 |
| 10,714,889 B2 * | 7/2020 | Hong | H01S 5/4075 |
| 2005/0017074 A1 * | 1/2005 | Tsikos | B82Y 15/00 |
| | | | 235/454 |
| 2010/0020066 A1 * | 1/2010 | Dammann | G01C 11/02 |
| | | | 345/419 |
| 2014/0293263 A1 * | 10/2014 | Justice | G01S 17/42 |
| | | | 356/4.01 |

(Continued)

FOREIGN PATENT DOCUMENTS

WO    WO-2017192474 A1 * 11/2017    ............ G01S 17/66

*Primary Examiner* — Mahendra R Patel
(74) *Attorney, Agent, or Firm* — Duft & Bornsen, PC (57) ABSTRACT

Jitter is removed from point cloud data by processing different groups of data points in the point cloud data in succession to minimize the entropy of the point cloud data. Each group in the point cloud data is generated at either different points in time or from detecting different pulses of reflected laser light from a target. The data points in a selected group are repetitively shifted en masse in the coordinate system of the point cloud data and the entropy of the point cloud data is re-calculated until subsequent shifts of the data points in the selected group does not further reduce the entropy. The remaining groups are subsequently processed in a similar fashion until the entropy of the point cloud data reaches a minimum.

20 Claims, 10 Drawing Sheets

(56) References Cited

U.S. PATENT DOCUMENTS

| | | | | |
|---|---|---|---|---|
| 2015/0071566 A1* | 3/2015 | Goodman | ............... | G06T 5/002 |
| | | | | 382/279 |
| 2015/0371431 A1* | 12/2015 | Korb | ................. | G06K 9/00208 |
| | | | | 382/113 |
| 2017/0350967 A1* | 12/2017 | Wilton | .................... | G01S 17/10 |
| 2019/0266741 A1* | 8/2019 | Uehara | .................... | G06T 7/12 |
| 2019/0370614 A1* | 12/2019 | Crouch | .................... | G06K 9/46 |
| 2019/0383941 A1* | 12/2019 | Siddiqui | ................. | G06T 7/521 |
| 2020/0150209 A1* | 5/2020 | Kirillov | ................. | G01S 17/10 |

* cited by examiner

DE-JITTER OF POINT CLOUD DATA

FIELD

This disclosure relates to the field of laser imaging, and in particular, to mitigating jitter in point cloud data.

BACKGROUND

Lidar (light detection and ranging) is a process that measures distances to a target by illuminating the target with laser light and measuring the reflected light with one or more sensors. Differences in the laser return times and/or wavelengths can then be used to make a digital 3-D representation of the target. Different types of lidar systems exist, including scanning lidar systems and flash lidar systems. Scanning lidar systems utilizes scanning optics with a laser to scan a target, while flash lidar systems diffuses the laser to illuminate the target with a single flash of light. In flash lidar systems, a grid of tiny sensors (e.g., planar photon detectors organized in rows and columns) captures the reflected light from the target.

Flash lidar operates similarly to a 2-D digital camera, with rows and columns of pixel sensors that have the additional capability of generating range information based on the time-of-flight of the illuminating laser pulse. The azimuth and elevation of the returning pulse can also be determined based on the orientation of the laser source with respect to the photon sensors. This type of information (e.g., angle-angle-range data) can be used to generate point cloud data in a 3-D coordinate system, which represents information about the surface of the target being illuminated.

While the point cloud data represents information about the target, jitter in the point cloud data represents errors in the underlying data that may make target recognition more difficult. Jitter occurs due to the relative motion of the various components in a flash lidar system with respect to the target and also with respect to each other, such as the laser source and the detector array. Thus, jitter is one form of inaccuracy in the point cloud data that could be improved in order to improve the accuracy of a target recognition process.

SUMMARY

In the embodiments described in the present disclosure, jitter is removed from point cloud data by processing different groups of data points in the point cloud data in succession to minimize the entropy of the point cloud data. Each group in the point cloud data is generated at either different points in time or from detecting different pulses of reflected laser light from a target. The data points in a selected group are repetitively shifted en masse in the coordinate system of the point cloud data and the entropy of the point cloud data is re-calculated until subsequent shifts of the data points in the selected group does not further reduce the entropy. The remaining groups are subsequently processed in a similar fashion until the entropy of the point cloud data reaches a minimum. One technical benefit is that the point cloud data is de-jittered.

One embodiment comprises a method of de-jittering point cloud data for target recognition. The method comprises generating point cloud data of a target comprising a plurality of groups of data points, each group captured at a different time, and selecting a group of data points for processing. The method further comprises, for the selected group, performing a de-jitter process on the point cloud data by calculating an entropy of the point cloud data, and repetitively shifting the data points in the selected group en mass in a spatial coordinate system of the point cloud data and recalculating the entropy using the shifted data points until the entropy is minimized. The method further comprises performing the de-jitter process on each remaining group of data points in turn to further reduce the entropy of the point cloud data, and identifying the target based on the de-jittered point cloud data.

In an embodiment of the method of de-jittering point cloud data for target recognition, generating the point cloud data further comprises repetitively illuminating the target using flash lidar.

In an embodiment of the method of de-jittering point cloud data for target recognition, generating the point cloud data further comprises detecting laser light reflected from the target utilizing a planar array of Geiger-mode avalanche photodiodes (APDs).

In an embodiment of the method of de-jittering point cloud data for target recognition, the entropy (S) comprises $S=-\Sigma_{k=1}^{M} \ln[\Gamma(N_k+1)]$, with M=a total number of APD sensors in the planar array, and $N_k$=a number of data points in a position of a $K^{th}$ APD sensor.

In an embodiment of the method of de-jittering point cloud data for target recognition, repetitively shifting the data points in the selected group comprises integer shifts in the spatial coordinate system that are based on quantized spatial detection characteristics of the planar array.

In an embodiment of the method of de-jittering point cloud data for target recognition, repetitively shifting the data points in the selected group comprises integer shifts in the spatial coordinate system that are based on quantized spatial characteristics of the point cloud data.

In an embodiment of the method of de-jittering point cloud data for target recognition, the target comprises an aircraft.

In an embodiment of the method of de-jittering point cloud data for target recognition, the method further comprises identifying which group has a higher number of data points than other groups, and selecting the identified group as an initial group for the de-jitter process.

In an embodiment of the method of de-jittering point cloud data for target recognition, the method further comprises performing the de-jitter process on each remaining group in an order based on a descending number of data points in each remaining group.

Another embodiment comprises a method of de-jittering point cloud data. The method comprises generating point cloud data of an unidentified target by ranging the unidentified target with a flash lidar device, where the point cloud data comprises a plurality of groups of data points, each group captured from different laser pulses reflected from the unidentified target. The method further comprises selecting a group of data points for processing, and for the selected group, performing a de-jitter process on the point cloud data by calculating an entropy of the point cloud data, and repetitively shifting the data points in the selected group as a unit in a spatial coordinate system of the point cloud data and recalculating the entropy using the shifted data points until the entropy is minimized. The method further comprises performing the de jitter process on each remaining group of data points in turn to further reduce the entropy of the point cloud data.

In some embodiments, the method of de-jittering the point cloud data further comprises identifying the unidentified target based on the de-jittered point cloud data.

In an embodiment of the method of de-jittering point cloud data, the entropy (S) comprises $S=-\Sigma_{k=1}^{M} \ln[\Gamma(N_k+1)]$, with M=a total number of photon sensors used to capture the point cloud data, and $N_k$=a number of data points generated in a position of a $K^{th}$ photon sensor.

In an embodiment of the method of de-jittering point cloud data, repetitively shifting the data points in the selected group comprises integer shifts in the spatial coordinate system that are based on quantized spatial detection characteristics of the photon sensors.

In an embodiment of the method of de-jittering point cloud data, the method further comprises identifying which group has a higher number of data points than other groups, and selecting the identified group as an initial group for the de-jitter process.

In an embodiment of the method of de-jittering point cloud data, the method further comprises performing the de-jitter process on each remaining group in an order based on a descending number of data points in each remaining group.

Another embodiment comprises a flash lidar system, comprising a laser, a transmitter, a receiver, a memory, and a processor. The laser generates laser light, and the transmitter illuminates a target with a plurality of pulses of the laser light. The receiver detects the laser light reflected from the target and generates point cloud data of the target comprising a plurality of groups of data points, each group captured at a different time. The memory stores the point cloud data, and the processor selects a group of data points for a de-jitter process. For the selected group, the processor calculates an entropy of the point cloud data, repetitively shifts the data points in the selected group together in a spatial coordinate system of the point cloud data and recalculates the entropy using the shifted data points until the entropy is minimized. The processor performs the de jitter process on each remaining group of data points in turn to further reduce the entropy of the point cloud data.

In an embodiment of the flash lidar system, the processor identifies the target based on the de-jittered point cloud data.

In an embodiment of the flash lidar system, the receiver comprises a planar array of Geiger-mode avalanche photodiodes (APDs) that detect the laser light reflected from the target and generate the point cloud data of the target.

In an embodiment of the flash lidar system, the entropy (S) comprises $S=-\Sigma_{k=1}^{M} \ln[\Gamma(N_k+1)]$, where M=a total number of APD sensors in the planar array, and where $N_k$=a number of data points in a position of a $K^{th}$ APD sensor.

In an embodiment of the flash lidar system, the processor performs integer shifts of the data points in the selected group in the spatial coordinate system that are based on quantized spatial detection characteristics of the planar array.

The features, functions, and advantages that have been discussed can be achieved independently in various embodiments or may be combined in yet other embodiments, further details of which can be seen with reference to the following description and drawings.

DESCRIPTION OF THE DRAWINGS

Some embodiments are now described, by way of example only, and with reference to the accompanying drawings. The same reference number represents the same element or the same type of element on all drawings.

DETAILED DESCRIPTION

The figures and the following description illustrate specific exemplary embodiments. It will be appreciated that those skilled in the art will be able to devise various arrangements that, although not explicitly described or shown herein, embody the principles described herein and are included within the contemplated scope of the claims that follow this description. Furthermore, any examples described herein are intended to aid in understanding the principles of the disclosure are to be construed as being without limitation. As a result, this disclosure is not limited to the specific embodiments or examples described below, but by the claims and their equivalents.

As discussed previously, jitter generated in point cloud data represents an underlying error in the data which, if mitigated, can improve various processes such as target recognition.

Figure 1:
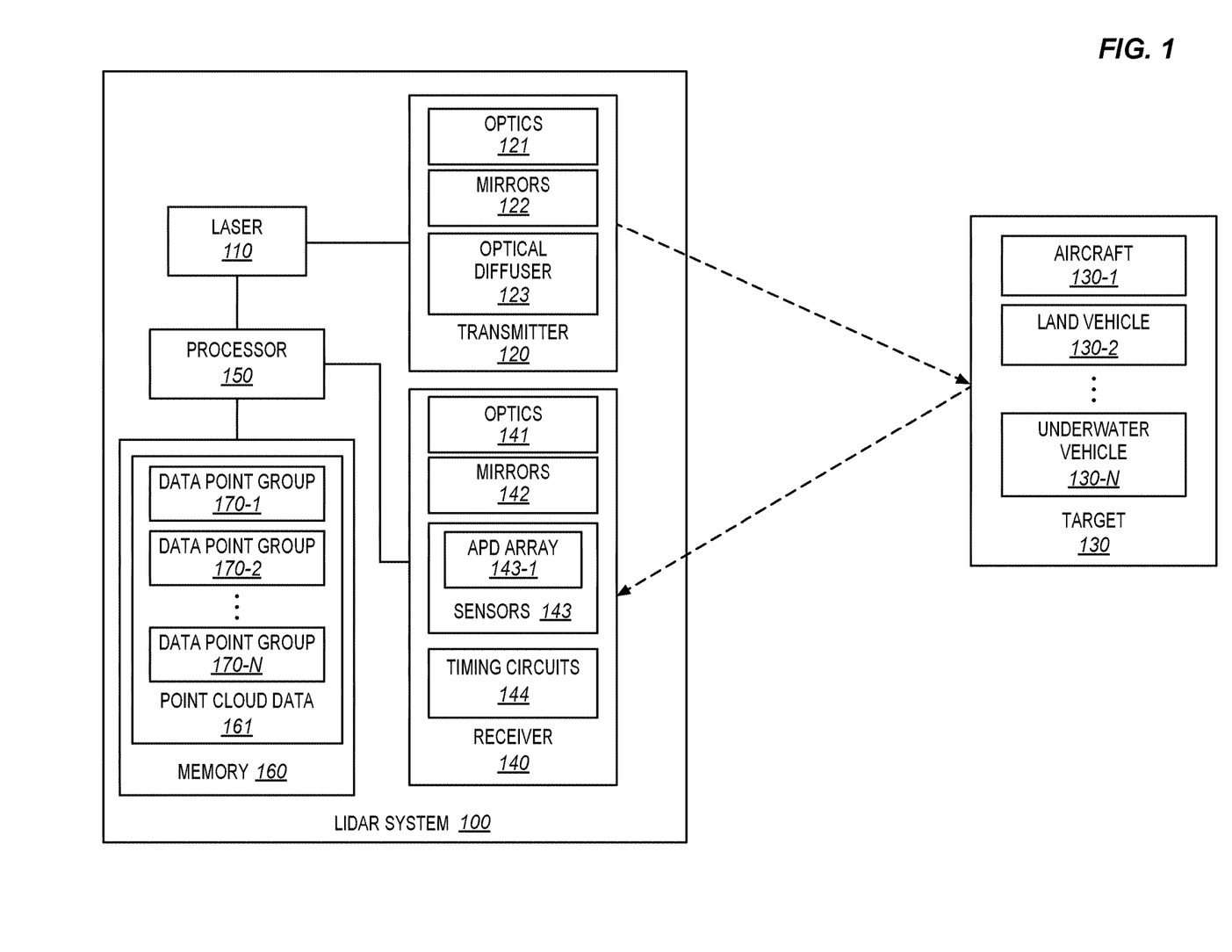
FIG. 1 depicts a lidar system in an illustrative embodiment.

FIG. 1 is a block diagram of a lidar system 100 in an illustrative embodiment. In this embodiment, lidar system 100 includes a laser 110 comprising any component, system, or device that generates pulsed laser light, and a transmitter 120 that illuminates a target 130 with one or more pulses of the laser light generated by laser 110. Laser 110 may generate pulsed laser light within different frequency ranges depending on the application. For example, 1550 nanometer laser light is eye-safe at relatively high-power levels, because this wavelength is not strongly absorbed by the eye. 1550 nm laser light is also not visible in night vision goggles, unlike the shorter 1000 nm infrared frequencies. Typical airborne applications use 1064 nm frequencies, while underwater applications use 532 nm frequencies that penetrate water with less attenuation than 1064 nm frequencies. In one embodiment, target 130 comprises an aircraft 130-1, although in other embodiments, target 130 may comprise a land vehicle 130-2 or an underwater vehicle 130-n.

Transmitter 120 comprises any component, system, or device that propagates the pulsed laser light to illuminate target 130. For example, transmitter 120 may include various optics 121, mirrors 122, optical diffusers 123, etc., which enable lidar system 100 to illuminate target 130 with pulsed laser light. A receiver 140 of lidar system 100 comprises any component, system, or device that receives pulsed laser light reflected from target 130. Receiver 140 may include optics 141, mirrors 142, sensors 143, timing circuits 144, etc., which detects the reflected pulsed laser light from target 130, and provides timing information for the photons received by receiver 140. Sensors 143 of receiver 140 may include various types of photon sensors as a matter of design choice. In some embodiments, sensors 143 includes multiple photon sensors arranged in a planar array, with each pixel sensor in the array configured to individually sense photons reflected from target 130 and generate timing information that is used to determine the range between lidar system 100 and target 130.

In one such embodiment, the array of photon sensors utilizes Geiger-mode avalanche photodiodes (APDs), which are fast sensing devices capable of sensing a single photon. An APD array 143-1, which is a type of sensor 143, generates quantized spatial data based on the distance between the pixels in the APD array 143-1, along with quantized spatial data in range that is based on the pulse rate of laser 110 and/or the dead time of the APDs between detecting successive photons.

A processor 150 of lidar system 100 is coupled to a memory 160. Processor 150 comprises any component, system, or device that interfaces with receiver 140 and generates point cloud data 161, which is stored by memory 160. In this embodiment, point cloud data 161 includes a plurality of data point groups 170. Each group 170 is generated in this embodiment based on the detection of one or more pulses of laser light, which ensures that the point data in groups 170 is well-correlated in jitter. In particular, point data generated based on a single pulse of laser light is highly correlated in jitter, and point data generated based on a short group of sequential laser pulses is also well correlated in jitter. This type of correlation enables the point data in each of groups 170 to be de-jittered en mass (e.g., together as a group or as a unit). Thus, the assignment of point data into groups 170 is not random or arbitrary, but rather, is based on temporally correlated photons received from target 130 by lidar system 100.

Point cloud data 161 is a collection of data points that represent the 3-D shape of the portion of target 130 illuminated by lidar system 100. Point cloud data 161 is derived based on the angle-angle-range data calculated by lidar system 100 for backscatter photons received from target 130.

Processor 150 includes any hardware device that is able to perform functions. Processor 150 may include one or more Central Processing Units (CPU), microprocessors, Digital Signal Processors (DSPs), Application-specific Integrated Circuits (ASICs), etc. Some examples of processors include INTEL® CORE™ processors, Advanced Reduced Instruction Set Computing (RISC) Machines (ARM®) processors, etc.

Memory 160 includes any hardware device that is able to store data, including point cloud data 161. Memory 160 may include one or more volatile or non-volatile Dynamic Random-Access Memory (DRAM) devices, FLASH devices, volatile or non-volatile Static RAM devices, hard drives, Solid State Disks (SSDs), etc. Some examples of non-volatile DRAM and SRAM include battery-backed DRAM and battery-backed SRAM.

Figure 2:
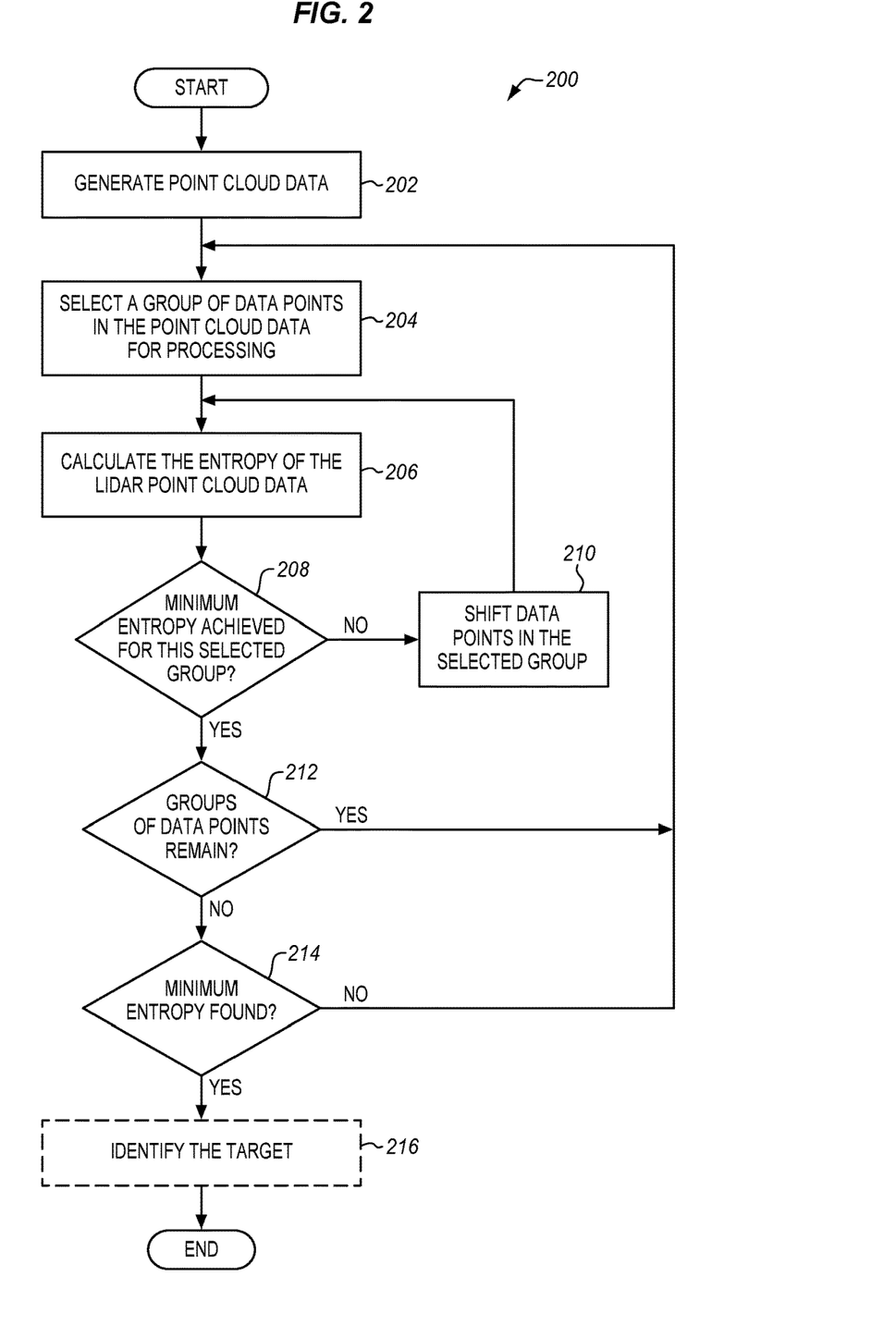
FIG. 2 is a flow chart of a method of de-jittering point cloud data in an illustrative embodiment.

FIG. 2 is a flow chart of a method 200 of de-jittering point cloud data in an illustrative embodiment. Method 200 will be described with respect to lidar system 100, although method 200 may apply to other systems, not shown. Method 200 may include other steps, not shown, and the steps may be performed in an alternate order. FIGS. 3A-3E are flow charts depicting additional steps of method 200 in illustrative embodiments.

Figure 3A:
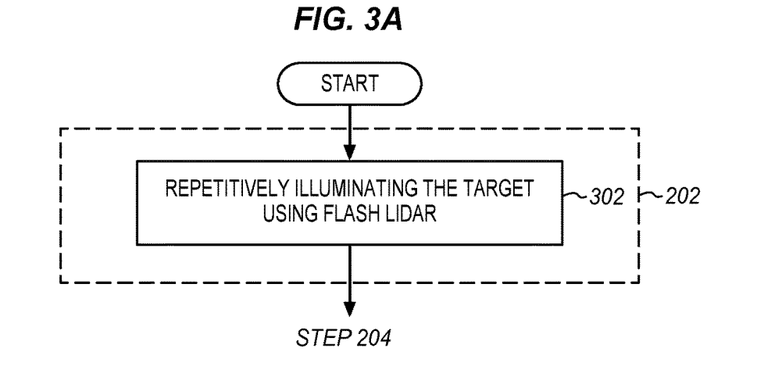
FIGS. 3A-3E are flow charts depicting additional steps of the method of FIG. 2 in illustrative embodiments.
Figure 3B:
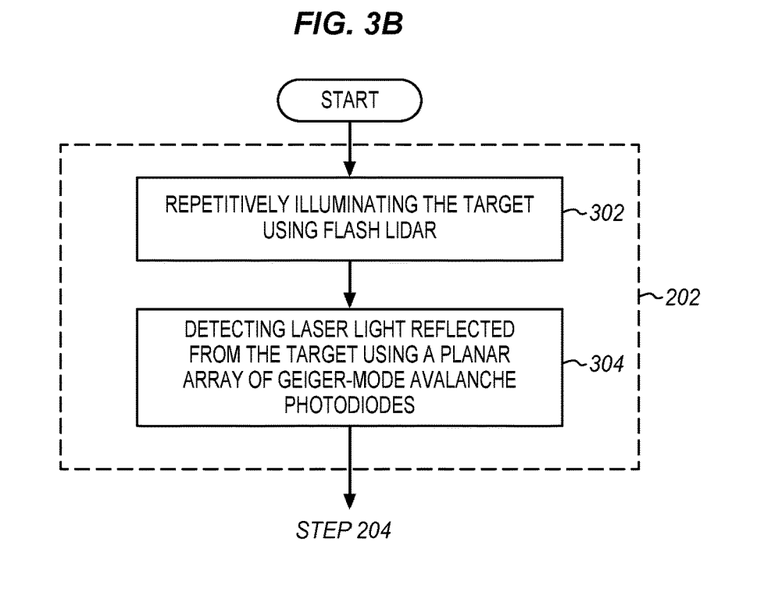

Lidar system 100 generates point cloud data 161 for target 130 (see step 202). In an embodiment, laser 110 generates one or more pulses of laser light, which is applied by transmitter 120 to illuminate target 130 (see step 302). Transmitter 120 receives the one or more pulses of laser light from laser 110 and, using optical diffuser 123, generates an expanding 3-D field of laser light that illuminates target 130 (see step 302). Target 130, now illuminated by the laser light, reflects a portion of the laser light pulses, which are received by receiver 140. In an embodiment, receiver 140 utilizes APD array 143-1 to detect the laser light reflected from target 130, which comprises APD devices organized in rows and columns (see step 304).

Figure 3C:
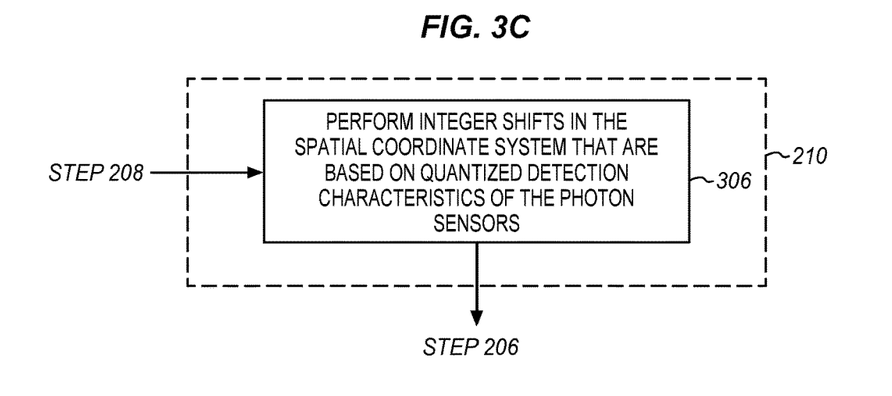
Figure 3D:
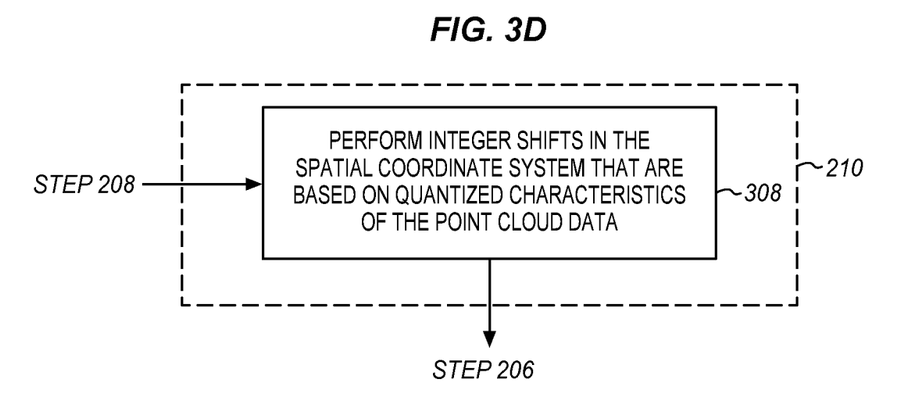
Figure 3E:
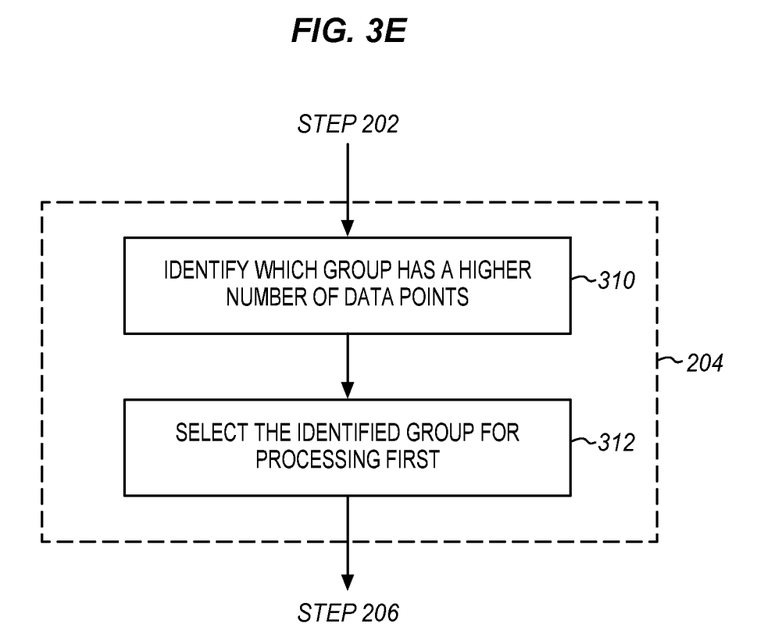

Processor 150 initially selects one of groups 170 for processing first (see step 204). In one embodiment, processor 150 may determine which of groups 170 includes the highest number of data points (see step 310), and selects this group 170 for processing first (see step 312). However, other selection criteria may be used in other embodiments. With respect to a de-jittering order, de-jittering from larger groups to smaller groups, groups with a larger number of data points have the potential for larger decreases in entropy than groups with fewer data points. Further, groups with a larger number of data points are more likely to have a single entropy minimum, and are therefore less likely to be improperly aligned. Once a few large groups are de-jittered, these groups tend to form a foundation for the alignment of smaller groups. For purposes of discussion, we will consider group 170-1 as being processed first.

Processor 150 calculates an entropy of point cloud data 161 (see step 206). Generally, a high entropy for point cloud data 161 results in a high amount of disorder or jitter, while a low entropy for point cloud data 161 results in a lower amount of disorder or jitter. While various methods of calculating the entropy for point cloud data 161 may be used as a matter of design choice, one specific embodiment for calculating entropy (S) uses the following equation 1:

$S = -\Sigma_{k=1}^{M} \ln[\Gamma(N_k+1)]$, where M=a total number of photon sensors (e.g., sensors 143) used to capture point cloud data 161, and where $N_k$=a number of data points in a position of a $K^{th}$ photon sensor.

In response to calculating the entropy, processor 150 determines if the minimum entropy has been found for processing group 170-1 (see step 208). Since this is the first time evaluating the entropy of point cloud data 161 while processing group 170-1, an iterative process is performed by shifting the data points in group 170-1 (see step 210) and recalculating the entropy of point cloud data 161 (see step 206). Generally, the number of shifts is finite, and the amount and direction of shifts in the spatial coordinate system of point cloud data 161 are based on the expected jitter in lidar system 100. For example, shifting group 170-1 comprises moving each data point in group 170-1 the same distance and direction in the spatial coordinate system of point cloud data 161 (e.g., en masse). In some embodiments, shifting the data points in groups 170 comprise integer shifts that are based on the quantized characteristics of sensors 143 (see step 306) or based on the quantized characteristics of point cloud data 161 (see step 308).

Typically, the jitter in range to target 130 is low, while the jitter in other dimensions is higher. This type of information may be used to constrain the direction and number of shifts for the data points in groups 170 when evaluating how the shifted data points reduce the entropy of point cloud data 161. Since point cloud data 161 includes a number of groups 170, shifting just one group 170 has a limited effect on reducing the overall entropy of point cloud data 161. Thus, while shifting group 170-1 does result in reducing the entropy of point cloud data 161, other groups 170 are processed as per group 170-1 in turn to further reduce the entropy of point cloud data 161, with the processing of each group 170 contributing to a portion of the total reduction in entropy for point cloud data 161.

Figure 4:
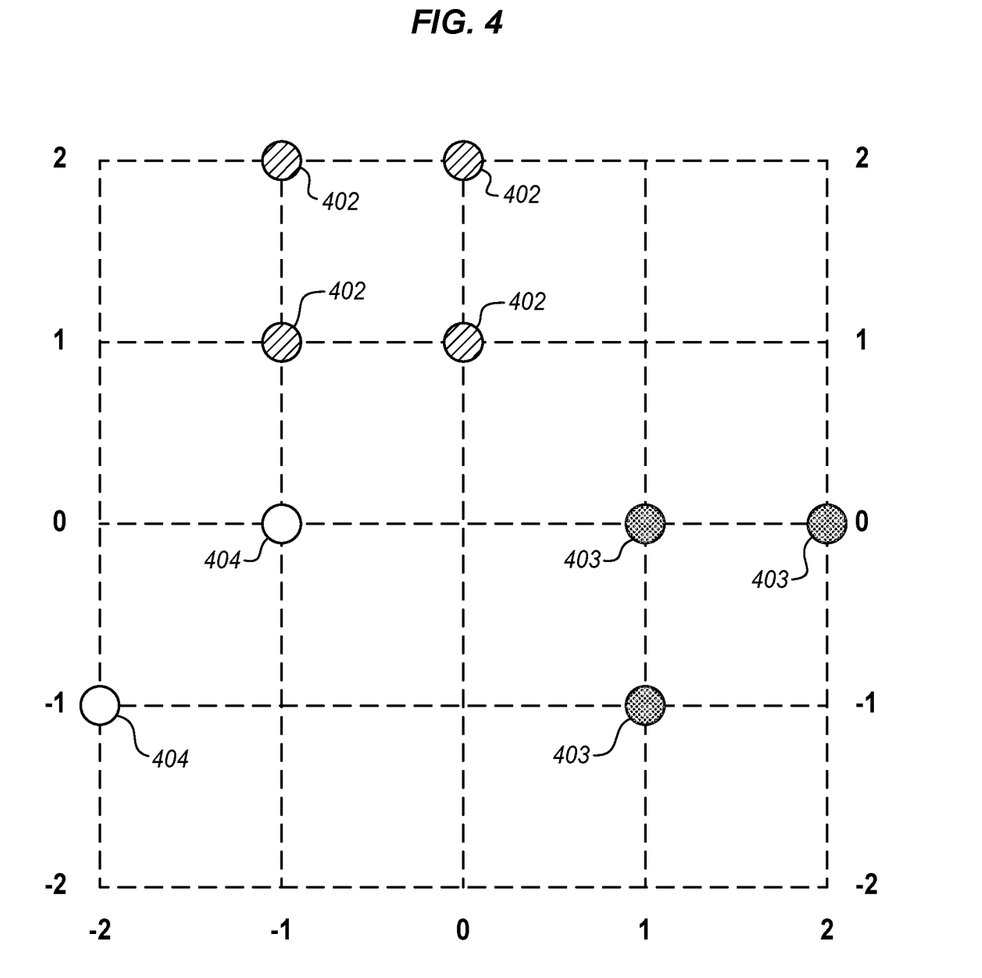
FIG. 4 depicts jittered point cloud data in an illustrative embodiment.

FIG. 4 depicts jittered point cloud data 161 for groups 170 in an illustrative embodiment. In this embodiment, group 170-1 corresponds to data points 402, group 170-2 corresponds to data points 403, and group 170-*n* corresponds to data points 404. As previously described, processing group 170-1, corresponding to data points 402, includes shifting data points 402 and re-calculating the entropy of point cloud data 161 in order to minimize the entropy of point cloud data 161.

Figure 5:
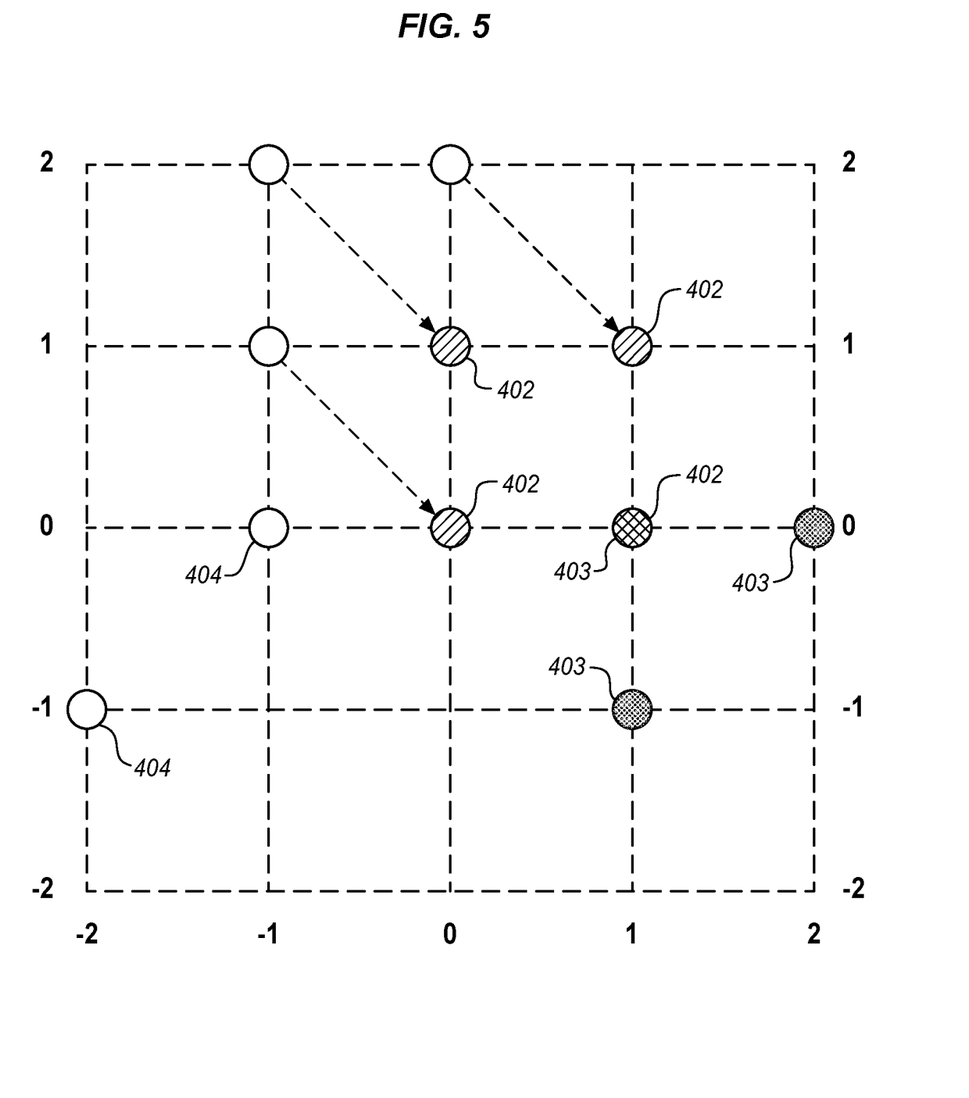
FIGS. 5-7 depict how data points in the point cloud may be shifted to reduce the entropy of the point cloud data.
Figure 6:
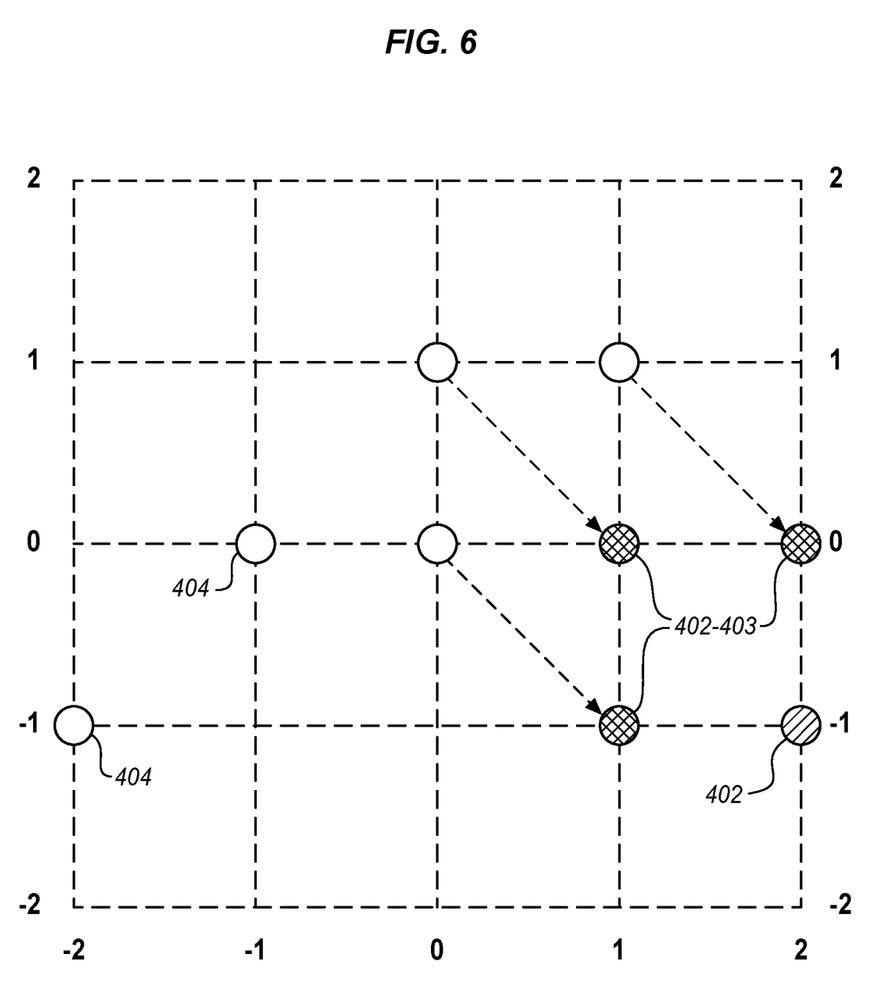

FIG. 5 illustrates how data points 402 for group 170-1 may be shifted and the entropy for point cloud data 161 re-calculated. Data points 402 are shifted from their previous spatial position in point cloud data 161 (indicated by dashed lines) to their new spatial position. In this embodiment, the spatial shifts are quantized (e.g., the shifts are integer shifts in a quantized spatial coordinate system of point cloud data 141). The entropy is recalculated for point cloud data 161 by processor 150 (see step 206), and processor 150 determines if shifting data points 402 further reduces the entropy for point cloud data 161 (see step 208). In the example of FIG. 5, assume that the entropy has decreased in response to shifting data points 402 as depicted in FIG. 5 towards data points 403, with some overlap of data points 402-403. Processor 150 repetitively performs steps 206-210 for data points 402 in group 170-1 until the entropy for point cloud data 161 reaches a minimum. For example, shifting data points 402 away from data points 403 raises the entropy in this case when data points 402 no longer overlap data points 403, and shifting data points 402 towards data points 403 decreases the entropy when more of data points 402 overlap data points 403. FIG. 6 illustrates how data points 402 for group 170-1 may be shifted to minimize the entropy in point cloud data 161. In this example, some of data points 402 and data points 403 are coincident. In other words, the spatial position of data points 403 represents the minimum entropy position for point cloud data 161 as calculated in step 208.

In response to minimizing the entropy of group 170-1, processor 150 determines if more groups 170 remain for processing. Since the processing of each group 170 includes the possibility of further reducing the entropy of point cloud data 161, subsequent groups 170 are processed in turn similar to group 170-1.

As group 170-2 and group 170-*n* remain in this example, processor 150 selects another group 170 for processing (see step 204). For example, processor 150 selects group 170-2. In some embodiments, groups 170 are selected in a specific order that depends upon how many data points 402-404 they include. For instance, if group 170-2 includes more data points than group 170-*n*, then processor 150 may select group 170-2 next for processing.

In response to selecting group 170-2, processor 150 iteratively performs steps 206-210 to shift data points 403 until another minimum entropy for point cloud data 161 is found. In particular, shifting data points 403 may further reduce the entropy that was obtained by first processing group 170-1.

In this example, data points 403 are already in a minimum entropy position, so shifting data points 403 away from their current position in FIG. 6 increases the entropy when fewer of data points 403 overlap data points 402. With the entropy minimized for data points 403, processor 150 selects group 170-*n* for processing, iteratively performing steps 206-210 to shift data points 404 and recalculate the entropy of point cloud data 161.

Figure 7:
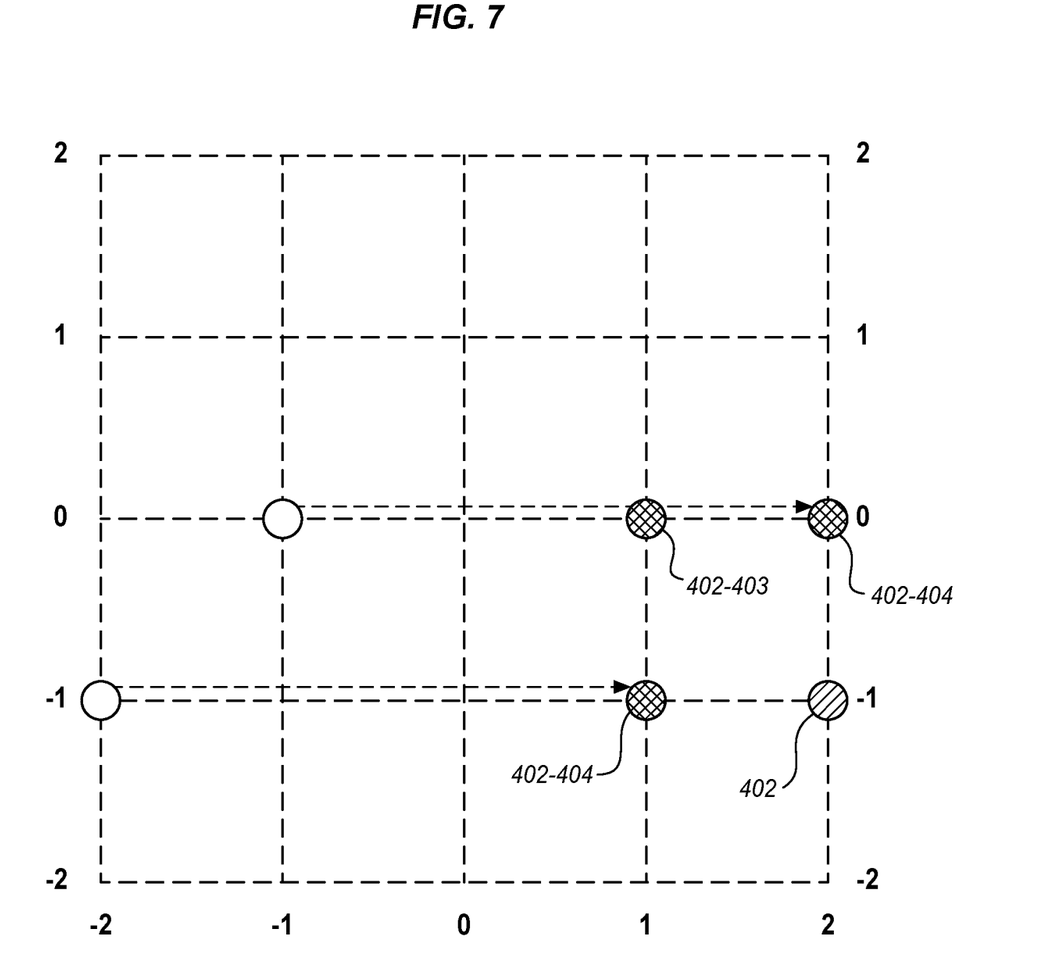

FIG. 7 illustrates the result of shifting data points 404 to minimize the entropy of point cloud data 161 in an illustrative embodiment. In FIG. 7, data points 404 are shifted until they are mostly coincident with data points 402-403, which is the minimum entropy position for data points 402-404 for point cloud data 161.

Processor 150 determines if additional groups 170 remain for processing (see step 212. If no groups 170 remain, then step 214 is performed to determine if a minimum entropy for point cloud data 161 has been found or if the entropy of point cloud data 161 is less than a threshold value. Since this is the first pass for processing groups 170, processor 150 may elect to re-process groups 170 to determine if the entropy can be reduced further from the first pass of processing.

If the minimum entropy has not been found, then processing returns to step 204 to select one of groups 170 for processing. Groups 170 are re-processed in turn until the entropy is minimized. Minimizing the entropy may, for instance, occur when shifting data points 402-404 in groups 170 does not reduce the entropy any further. In some embodiments, processor 150 determines that the minimum entropy for point cloud data 161 has been found in step 214 and/or step 208 when the entropy decrease from one iteration to the next is less than a threshold value. In this embodiment, further processing of groups 170 has a declining benefit of reducing the overall entropy of point cloud data 161. The result of minimizing the entropy of point cloud data 161 is that the jitter of point cloud data 161 is reduced. This provides a technical benefit when point cloud data 161 is used for subsequent processes, such as a target recognition process. In a target recognition process, processor 150 utilizes the de-jittered point cloud data 161 to identify target 130 (see optional step 216 of FIG. 2). In particular, de-jittered point cloud data 161 provides a technical benefit of allowing for a more accurate target recognition process.

Figure 8:
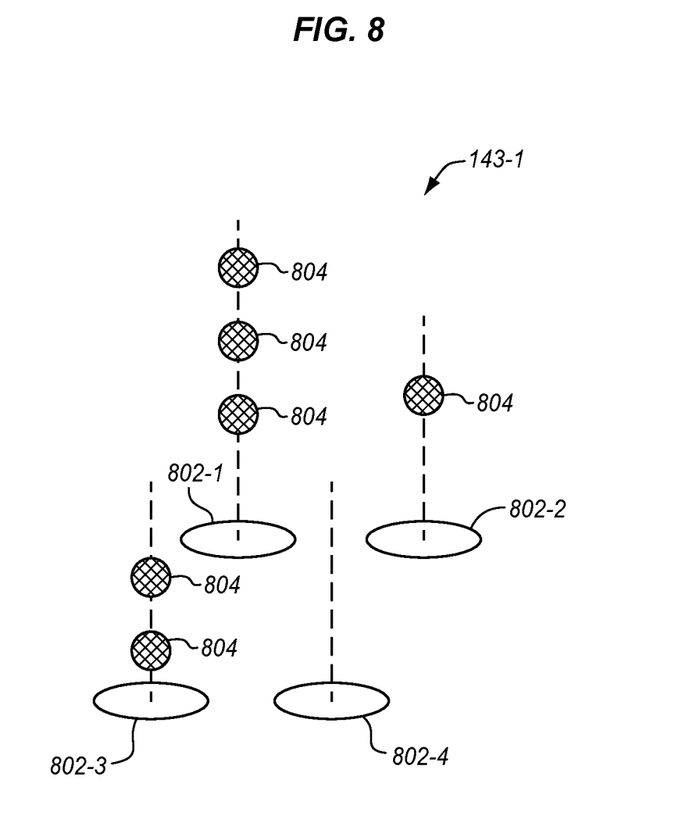
FIG. 8 depicts how entropy may be calculated for point cloud data in an illustrative embodiment.
Figure 9A:
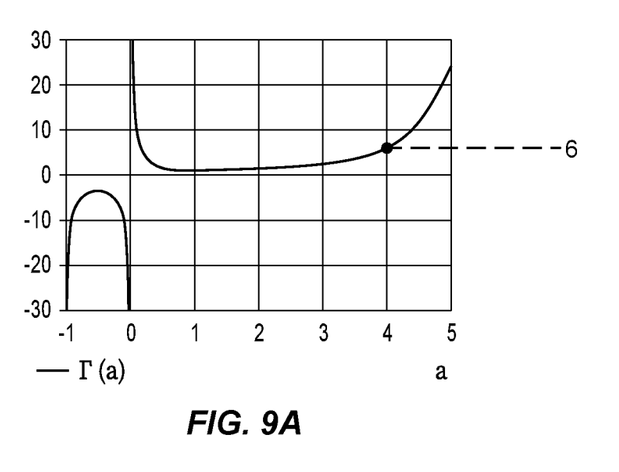
FIGS. 9A-9D are graphs of different gamma function results for the example of FIG. 8 in illustrative embodiments.
Figure 9B:
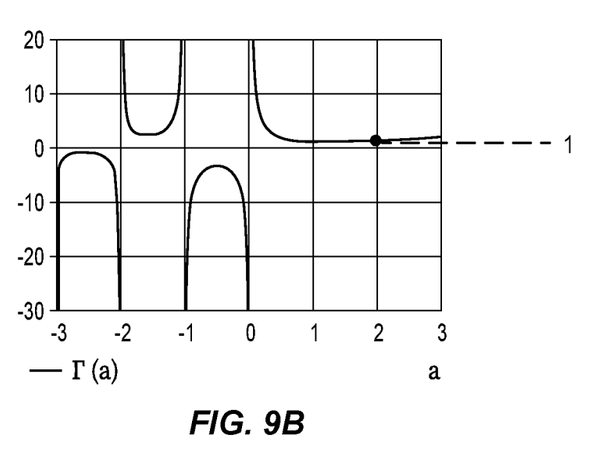
Figure 9C:
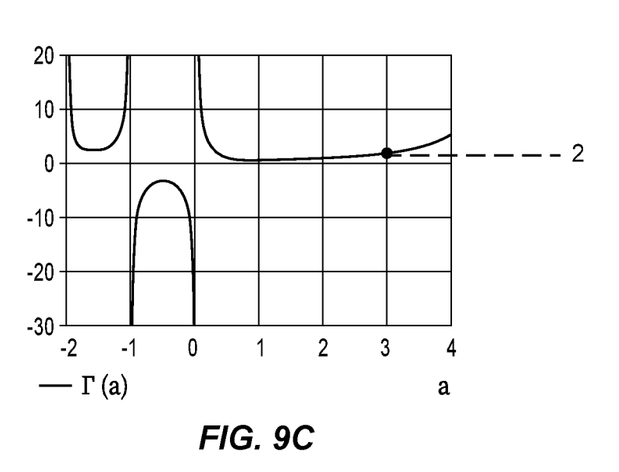
Figure 9D:
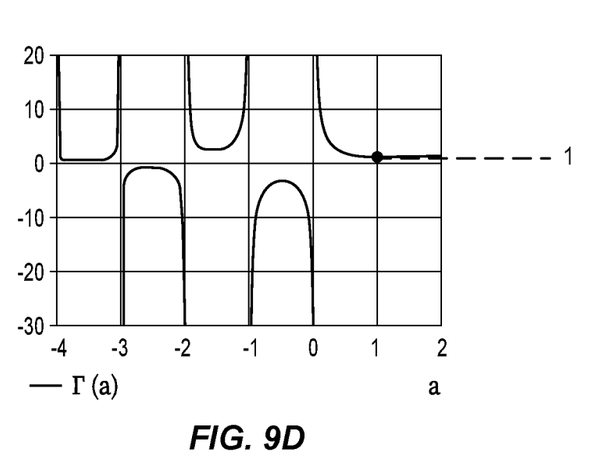

As discussed previously, equation 1 may be used in some embodiments to calculate the entropy of point cloud data 161. FIG. 8 depicts an example of how entropy may be calculated for point cloud data 161 in an illustrative embodiment. FIG. 8 depicts one example of APD array 143-1, which includes four APD sensors 802. In the example illustrated in FIG. 8, sensor 802-1 generates three data points 804, sensor 802-2 generates one data point 804, sensor 802-3 generates two data points 804, and sensor 802-4 generates zero data points.

The resulting use of equation 1 resolves to the following equation 2 for entropy (S):

$S = -\Sigma_{k=1}^{4} \ln[\Gamma(N_k + 1)]$, where M=a total number of APD sensors 802, and where $N_k$=a number of data points generated by a $K^{th}$ photon sensor.

Based on the example illustrated in FIG. 8, equation 2 decomposes to the following result:

$$S = -(\ln[\Gamma(3+1)] + \ln[\Gamma(1+1)] + \ln[\Gamma(2+1)] + \ln[\Gamma(0+1)]).$$

FIG. 9A-9D depict graphs of the result of the gamma function ($\Gamma$) for $\Gamma 4$, $\Gamma 2$, $\Gamma 3$, and $\Gamma 1$, respectively in illustrative embodiments, which equation 3 being the result:

$$S = -(\ln[6] + \ln[(1)] + \ln[(2)] + \ln[(1)]), \text{ or}$$
$$S = \text{about } -2.485.$$

In the previous example, illustrated in FIGS. 4-7, there are M=25 sensor positions in the 5×5 grid. If there is no overlap between data points 402-404 in groups 170 whatsoever, then each of the 25 sensor positions contain either 0 data points or 1 data point. The gamma function for these two cases is the same: $\Gamma(0+1) = \Gamma(1+1) = 1$. Thus, the entropy for all configurations with no overlap is $S = -(\ln[1] + \ln[1] + \ldots + \ln[1]) = -25 \ln[1] = -25 \times 0 = 0$. If there is exactly one overlap between a data point in one group and a data point in another group (e.g., as illustrated in FIG. 5 for data points 402-403), then all the 25 grid positions except 1 contains either 0 or 1 data points and the remaining grid position has 2 data points. So the total entropy in all such cases is S=−24 ln[1]−1 ln[Γ(2+1)]=−(24×0)−ln[2]=−ln[2]≈−0.693. By a similar argument, if the only overlap is between 2 data points in one group and 2 data points in another group, then the entropy is S=−23 ln[1]−2 ln[Γ(2+1)]=−(23×0)−2 ln[2]=−2 ln[2]≈−1.386. If all three groups 170 are in alignment as illustrated in FIG. 7, then the total entropy is S=−21 ln[1]−2 ln[Γ(3+1)]−1 ln[Γ(2+1)]−1 ln[Γ(1+1)]=−(22×0)−2 ln[6]−1 ln[2]−1 ln[1]≈−4.28.

Any of the various elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments were described herein, the scope is not limited to those specific embodiments. Rather, the scope is defined by the following claims and any equivalents thereof

What is claimed is:

1. A method comprising:
   generating point cloud data of a target comprising a plurality of groups of data points by repetitively illuminating the target with laser light and detecting the laser light reflected from the target utilizing a planar array, each group captured at a different time;
   selecting a group of data points for processing;
   for the selected group, performing a de-jitter process on the point cloud data by:
     calculating an entropy of the point cloud data; and
     repetitively shifting the data points in the selected group en masse in a spatial coordinate system of the point cloud data and recalculating the entropy using the shifted data points until the entropy is minimized;
   performing the de-jitter process on each remaining group of data points in turn to further reduce the entropy of the point cloud data; and
   identifying the target based on the de-jittered point cloud data.

2. The method of claim 1, wherein generating the point cloud data further comprises:
   repetitively illuminating the target using flash lidar.

3. The method of claim 2, wherein generating the point cloud data further comprises:
   detecting the laser light reflected from the target utilizing a planar array of Geiger-mode avalanche photodiodes (APDs).

4. The method of claim 3, wherein the entropy (S) comprises:

$$S = \sum_{k=1}^{M} -\ln[\Gamma(N_k + 1)]$$

wherein M=a total number of APD sensors in the planar array, and
   wherein $N_k$=a number of data points in a position of a $K^{th}$ APD sensor.

5. The method of claim 3, wherein:
   repetitively shifting the data points in the selected group comprises integer shifts in the spatial coordinate system that are based on quantized spatial detection characteristics of the planar array.

6. The method of claim 1, wherein:
   repetitively shifting the data points in the selected group comprises integer shifts in the spatial coordinate system that are based on quantized spatial characteristics of the point cloud data.

7. The method of claim 1, wherein:
   the target comprises an aircraft.

8. The method of claim 1, further comprising:
   identifying which group has a higher number of data points than other groups; and
   selecting the identified group as an initial group for the de-jitter process.

9. The method of claim 8, further comprising:
   performing the de-jitter process on each remaining group in an order based on a descending number of data points in each remaining group.

10. A method, comprising:
    generating point cloud data of an unidentified target by ranging the unidentified target with a flash lidar device and detecting laser pulses reflected from the target utilizing a planar array, wherein the point cloud data comprises a plurality of groups of data points, each group captured from different laser pulses reflected from the unidentified target;
    selecting a group of data points for processing;
    for the selected group, performing a de-jitter process on the point cloud data by:
      calculating an entropy of the point cloud data; and
      repetitively shifting the data points in the selected group as a unit in a spatial coordinate system of the point cloud data and recalculating the entropy using the shifted data points until the entropy is minimized; and
    performing the de-jitter process on each remaining group of data points in turn to further reduce the entropy of the point cloud data.

11. The method of claim 10, further comprising:
    identifying the unidentified target based on the de-jittered point cloud data.

12. The method of claim 10, wherein the entropy (S) comprises:

$$S = \sum_{k=1}^{M} -\ln[\Gamma(N_k + 1)]$$

wherein M=a total number of photon sensors used to capture the point cloud data, and wherein $N_k$=a number of data points in a position of a $K^{th}$ photon sensor.

13. The method of claim 12, wherein:

repetitively shifting the data points in the selected group comprises integer shifts in the spatial coordinate system that are based on quantized spatial detection characteristics of the photon sensors.

14. The method of claim 10, further comprising:

identifying which group has a higher number of data points than other groups; and selecting the identified group as an initial group for the de-jitter process.

15. The method of claim 14, further comprising:

performing the de-jitter process on each remaining group in an order based on a descending number of data points in each remaining group.

16. A flash lidar system, comprising:

a laser configured to generate laser light;

a transmitter configured to illuminate a target with a plurality of pulses of the laser light;

a receiver utilizing a planar array configured to detect the laser light reflected from the target and to generate point cloud data of the target comprising a plurality of groups of data points, each group captured at a different time;

a memory configured to store the point cloud data; and a processor configured to select a group of data points for a de-jitter process, and for the selected group, to calculate an entropy of the point cloud data, to repetitively shift the data points in the selected group together in a spatial coordinate system of the point cloud data and recalculate the entropy using the shifted data points until the entropy is minimized, wherein the processor is configured to perform the de-jitter process on each remaining group of data points in turn to further reduce the entropy of the point cloud data.

17. The flash lidar system of claim 16, wherein:

the processor is configured to identify the target based on the de-jittered point cloud data.

18. The flash lidar system of claim 16, wherein:

the receiver comprises a planar array of Geiger-mode avalanche photodiodes (APDs) that are configured to detect the laser light reflected from the target and to generate the point cloud data of the target.

19. The flash lidar system of claim 18, wherein the entropy (S) comprises:

$$S = \sum_{k=1}^{M} -\ln[\Gamma(N_k + 1)]$$

wherein M=a total number of APD sensors in the planar array, and wherein $N_k$=a number of data points in a position of a $K^{th}$ APD sensor.

20. The flash lidar system of claim 18, wherein:

the processor is configured to perform integer shifts of the data points in the selected group in the spatial coordinate system that are based on quantized spatial detection characteristics of the planar array.

* * * * *